United States Patent [19]

Chang et al.

[11] 4,076,559
[45] Feb. 28, 1978

[54] TEMPERATURE GRADIENT ZONE MELTING THROUGH AN OXIDE LAYER

[75] Inventors: Mike F. Chang, Liverpool; Thomas R. Anthony; Harvey E. Cline, both of Schenectady, all of N.Y.

[73] Assignee: General Electric Company, Auburn, N.Y.

[21] Appl. No.: 778,859

[22] Filed: Mar. 18, 1977

[51] Int. Cl.² .......................................... H01L 21/225
[52] U.S. Cl. ..................................... 148/1.5; 148/188
[58] Field of Search ......................... 148/1.5, 188, 178

[56] References Cited

U.S. PATENT DOCUMENTS

| | | | |
|---|---|---|---|
| 2,813,048 | 11/1957 | Pfann | 148/1 |
| 3,897,277 | 7/1975 | Blumenfeld | 148/1.5 |
| 3,899,362 | 8/1975 | Cline et al. | 148/1.5 |
| 3,901,736 | 8/1975 | Anthony et al. | 148/1.5 |
| 3,998,662 | 12/1976 | Anthony et al. | 148/1.5 |
| 4,042,448 | 8/1977 | Chang | 148/188 X |

*Primary Examiner*—G. Ozaki
*Attorney, Agent, or Firm*—R. J. Mooney; S. B. Salai

[57] ABSTRACT

Disclosed is a method of manufacturing semiconductor devices by thermomigrating impurities through an oxide layer.

20 Claims, 11 Drawing Figures

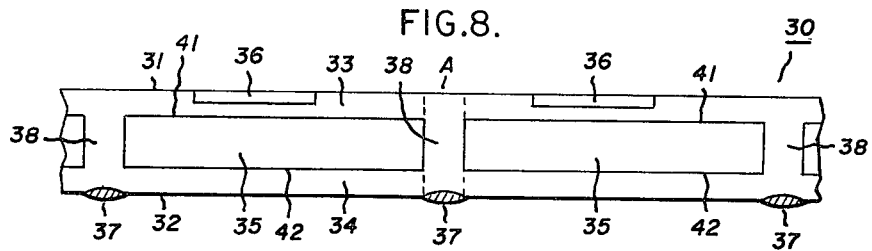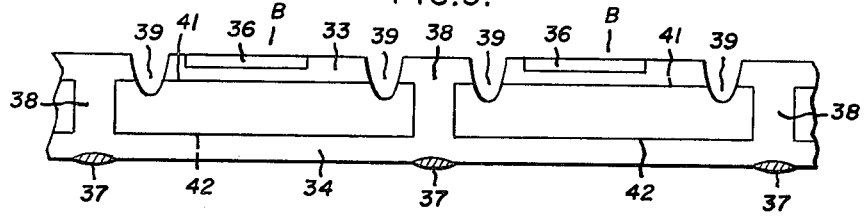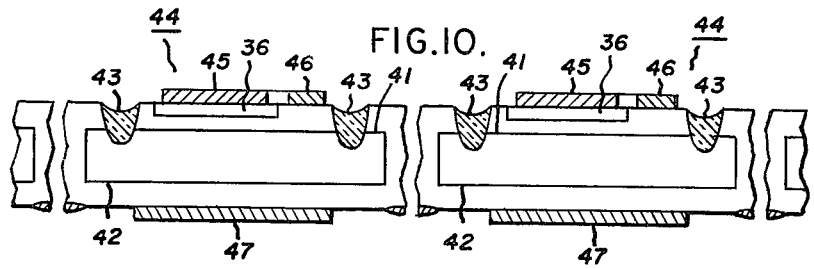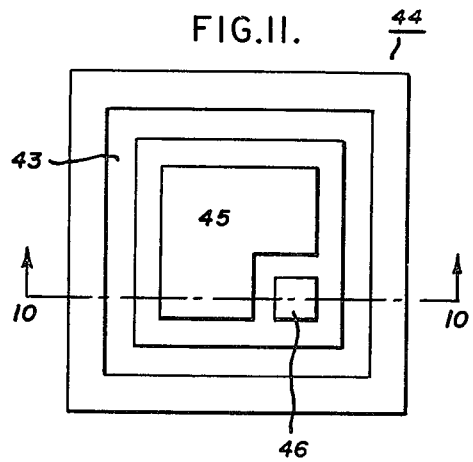

TEMPERATURE GRADIENT ZONE MELTING THROUGH AN OXIDE LAYER

BACKGROUND OF THE INVENTION

This invention relates to the fabrication of semiconductor devices and, more particularly, to a method of doping bodies of semiconductor material by temperature gradient zone melting.

In the manufacture of semiconductor devices, it is usually necessary to alter or tailor the conductivity type of a body, or of parts of a body, of a semiconductor material. This alteration is provided by distributing atoms of conductivity modifying impurities in a selected region or selected regions of the body. Several techniques for achieving that distribution are widely practiced today. For example, doping is provided by alloying, diffusion, epitaxial growth, and the like. The choice among the various methods is made on the basis of such considerations as cost and the character of the junction desired. Alloying, for example, provides very sharp but shallow junctions. Diffusion can provide a deeper junction but it is less sharp.

Temperature gradient zone melting is a method of doping semiconductor material that can provide very abrupt junctions coupled with high dopant concentrations. Specifically, temperature gradient zone melting provides doped regions containing a dopant concentration up to the solid solubility limit of the dopant. Another virtue of temperature gradient zone melting is that doped regions of unusual configuration can be provided. Early descriptions of temperature gradient zone melting and some of its applications will be found in U.S. Pat. No. 2,813,048 issued to W. G. Pfann, and in his book, *Zone Melting,* copyright 1958 by John Wiley and Sons, Inc.

While temperature gradient zone melting was known as a method of doping semiconductors very early in the life of the semiconductor industry, certain considerations prevented early its adoption as a standard tool of the semiconductor device design engineer. One such concern has been the treatment of the surface through which the impurity is to enter the body of semiconductor material. Such characteristics as surface uniformity and means to restrain the lateral spread on the surface of the impurity prior to the initiation of migration have been of interest. For example, see U.S. Pat. Nos. 3,897,277 (Blumenfeld) and 3,899,362 (Cline, et al), both assigned to the present assignee.

It is therefore an object of this invention to provide a temperature gradient zone melting technique which simplifies surface treatment requirements.

SUMMARY OF THE INVENTION

This invention is practiced by selectively depositing an impurity on an oxide layer overlying a surface of a semiconductor body. The oxide is preferably either silicon or germanium. The selective deposition step can include, if desired, such sub-steps or variations as a blanket deposition of impurity followed by a selective removal process such as photolithographic-etching, or the like. Following deposition, the impurity is caused to thermally migrate, first through the oxide to the underlying semiconductor body and then on into or through the semiconductor body, utilizing prior art temperature gradient zone melting steps. When first discovered, this migration-through-oxide technique was quite surprising inasmuch as the prior art clearly teaches that the surface of the semiconductor body must be free of oxide, at least where the impurity is to enter.

DESCRIPTION OF THE DRAWINGS

These and other features and objects of the present invention will become more apparent upon a perusal of the following description taken in conjunction with the accompanying drawings wherein:

FIG. 8 is an elevation view of the wafer of FIG. 7 following thermomigration;

FIG. 9 is an elevation view of the wafer following the formation of certain peripheral grooves;

FIG. 10 illustrates finished SCR (Semiconductor Controlled Rectifier) device pellets fabricated in accordance with the teachings herein;

FIG. 11 is a plan view of a completed SCR pellet fabricated in accordance with the teachings herein.

DESCRIPTION OF THE PREFERRED METHOD

Temperature gradient zone melting, as practiced in the semiconductor industry, is a process in which a small amount of impurity or dopant material is placed on a body of semiconductor material and the combination is exposed to a temperature gradient at an elevated temperature. The overall temperature at which the process is carried out must be sufficiently high that a melt containing both materials will be formed. The temperature gradient can vary from a few degrees to a few hundred degrees across the body of semiconductor material. Under these conditions, the melt will migrate directly along the temperature gradient lines from low temperature toward high temperature leaving in its path a recrystallized region of semiconductor material containing the dopant in an amount equal to the solid solubility limit of the dopant at the elevated temperature.

Figure 1:
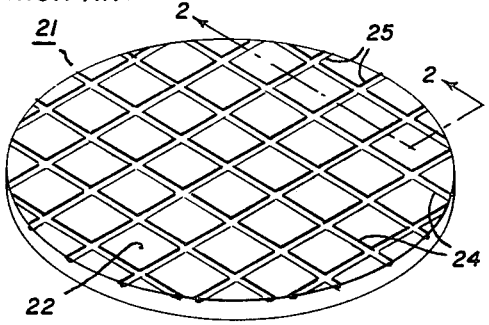
FIG. 1 is an isometric view of a semiconductor wafer with a suitable pattern of impurity or dopant material deposited thereon to permit practice of temperature gradient zone melting in accordance with the teaching of the prior art.
Figure 2:
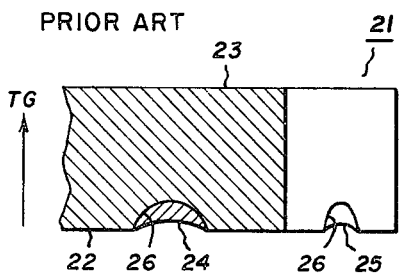
FIG. 2 is an enlarged sectional detail view of a portion of the wafer shown in FIG. 1 in an inverted position.

Referring first to the prior art FIGS. 1 and 2, there is shown a body of semiconductor material 21. The material 21 can be any suitable semiconductor material such as silicon, germanium, silicon carbide or gallium arsenide. For purposes of illustration, the body 21 can be considered a wafer of n-type silicon defining a first major surface 22 and a second major surface 23 as clearly shown in FIG. 2. It will be appreciated that FIG. 2 is shown in an inverted orientation with respect to FIG. 1. The wafer is shown as inverted because it is normally in that inverted position during thermal migration.

Normally, the wafer 21 will have a wide distribution of atoms of a dopant material that induces a given conductivity type in the silicon. Generally, this given conductivity type will be opposite to the conductivity type of the dopant that is to be thermally migrated through the wafer 21.

The prior art thermal migration process involves depositing on the surface 22, in a preselected pattern, a quantity of dopant material that will impart to the silicon a selected conductivity type. An example of a dopant that works well with silicon is aluminum. It should be stressed at this point that the preselected pattern can be any pattern desired. For example, as illustrated in FIG. 1, the preselected pattern includes a plurality of orthogonal intersecting linear regions 24 and 25 that divide the wafer 21 into a grid. By way of illustration, such a patterned arrangement of the dopant material can be applied to the semiconductor wafer surface 22 in the form of a plurality of aluminum wires 24 contacting surface 23.

Preferably, the wafer is formed so that the surfaces 22 and 23 are in the {111} crystallographic plane. Under these conditions, the linear aluminum wires 24 should be arranged in the <110> orientation. Other exemplary conditions conducive to predetermined migration with desired stability are included in the following table:

| Wafer Plane | Migration Direction | | Stable Wire Directons | Stable Wire Sizes |
|---|---|---|---|---|
| {100} | < 100 > | | < 011 >* | <100 microns |
| | | | < 0$\bar{1}$1 >* | <100 microns |
| {110} | < 110 > | | < 1$\bar{1}$0 >* | <150 microns |
| {111} | < 111 > | + a) | < 01$\bar{1}$ > | |
| | | | < 10$\bar{1}$ > | <500 microns |
| | | | < 1$\bar{1}$0 > | |
| | | b) | < 11$\bar{2}$ >* | |
| | | | < $\bar{2}$11 >* | <500 microns |
| | | | < 1$\bar{2}$1 >* | |
| | | c) | Any other direction in {111} plane* | <500 microns |

*The stability of the migrating wire is sensitive to the alignment of the thermal gradient with the <100>, <110> and <111> axis, respectively.
+Group a) is more stable than Group b) which is more stable than Group c).

Referring now only to FIG. 2, it will be appreciated that the wires 24 and 25 lie in grooves 26 in the surface 22 as is taught by the prior art. Furthermore, in the prior art the wires 24 and 25 were frequently alloyed to the recessed surface of wafer 21 defining the grooves 26.

Figure 3:
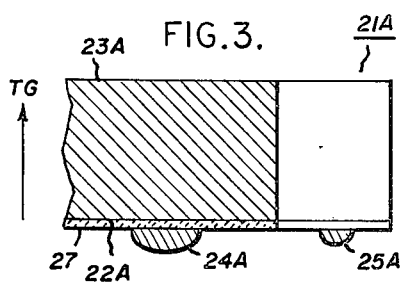
FIG. 3 is a sectional elevation view similar to FIG. 2, but of a wafer for use in the practice of the present invention.

Referring now to FIG. 3, there is shown a wafer 21A having two major surfaces 22A and 23A, at least one of which has an oxide layer 27 thereon. The wafer can be of any suitable semiconductor material such as silicon, germanium, silicon carbide or gallium arsenide, and the oxide is either the oxide of silicon or germanium, and can be established by any suitable technique such as thermally growing, deposition, or the like. In accordance with the present teachings, metal wires 24A and 25A, preferably of aluminum or gallium, are selectively deposited directly on the exterior surface of the oxide layer.

Quite surprisingly, we have discovered that the wires will migrate through the oxide, and thence into and through the wafer if normal temperature gradient zone melting heating conditions are carried out. Typical temperatures, times and gradients are well known and can be gleaned from an observation of U.S. Pat. No. 4,001,047 (Boah) and assigned to the present assignee.

It is preferred that the oxide have a thickness in the range of at least 6,000 Angstroms, which is a minimum to assure good surface uniformity, up to about 25,000 Angstroms. Though thicker oxides require longer thermal migration times, thicker oxides are desirable for stability as aluminum thickness is increased. Excellent results have been obtained with migration through about 12,000 Angstroms of oxide.

The selective deposition of the dopant material can be a blanket deposition, for example of aluminum, followed by photolithographic etching. An example of one suitable etchant which will remove aluminum, but leave the underlying silicon oxide undisturbed is "Pan Etch", which consists of:

| | |
|---|---|
| Ortho Phosphoric Acid | 76 % |
| Acetic Acid | 6 % |
| Nitric Acid | 3 % |
| Water | 15 %. | and wherein all of the foregoing acid constituents are of a saturated concentration.

Figure 4:
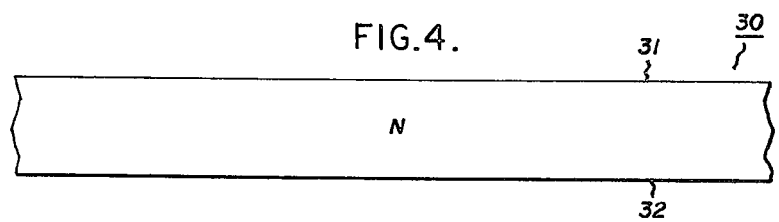
FIG. 4 is a sectional elevation view of a semiconductor wafer and of exaggerated scale in the vertical dimension to facilitate understanding of the invention.

Following is an example illustrating an application of the subject teaching:

Referring to FIG. 4, there is shown a wafer 30 of semiconductor material which defines two major surfaces 31 and 32. The wafer may be any convenient size such as is normally used in the semiconductor processing art. For example, it may be approximately 16 mils in thickness and 2 inches in diameter. Only a portion of the wafer 30 is shown in FIG. 4 in order to preserve clarity in the Figures.

The wafer 30 contains a first type of impurity that imparts to the wafer one conductivity type. For purposes of illustration, it will subsequently be assumed that the wafer 30 consists of silicon and that the one conductivity type is N-type. Thus, the first type of impurity is an impurity that imparts N-type conductivity, such as arsenic or phosphorus.

Figure 5:
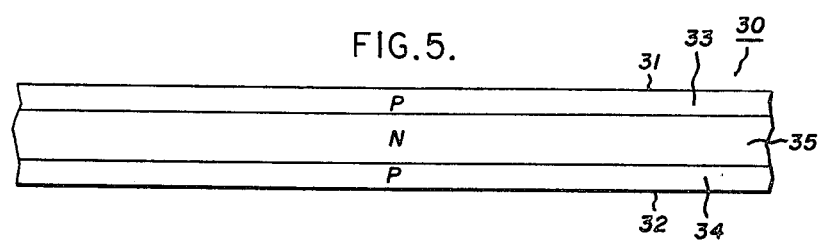
FIG. 5 is a sectional elevation view of the wafer of FIG. 4 following initial diffusion.

Referring now to FIG. 5, there is shown an elevation view of the wafer 30 following a subsequent processing step. A second type of impurity which imparts to the wafer the opposite, or P, conductivity type is diffused in from each major surface. The second type of impurity can be, for example, gallium or boron. Thus, the wafer 30 has three stacked layers or regions, two outer P-type regions 33 and 34, and an interior N-type region 35. In the example being pursued, that is utilizing a 16 mil thick wafer, the regions 33 and 34 are each preferably about three mils in thickness. A three-mil depth will be reached following a diffusion time of about 45 hours at 1250° C. Such diffusion cycles are well known in the prior art.

Figure 6:
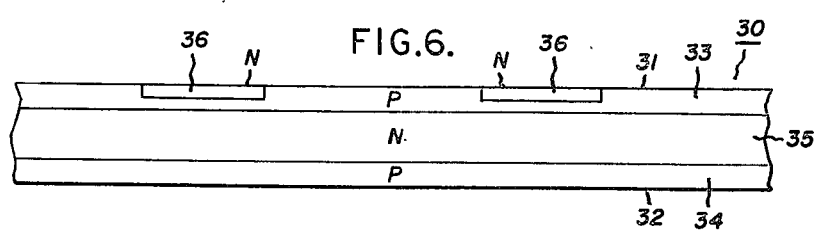
FIG. 6 is an elevation view of the wafer of FIGS. 4 and 5 following yet another diffusion step.

Referring now to FIG. 6, there is shown the wafer of FIG. 5 with spaced cathode emitter regions 36 diffused part way through the region 33. The cathode emitter regions are N-type and can be formed by the diffusion of a first type of impurity at 1250° C for approximately ten to fifteen hours. Again, such diffusion cycles are well known in the prior art as are the preceding photoresist masking steps. The cathode emitter regions could also be formed by other conventional techniques, such as alloying.

Figure 7:
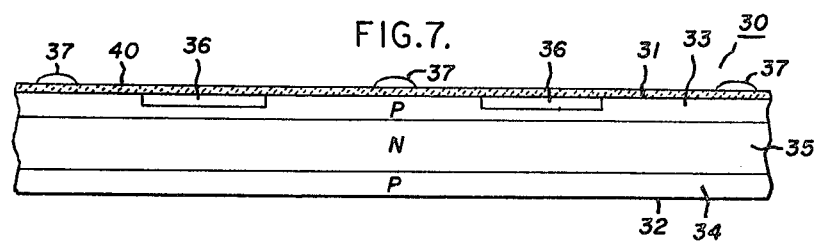
FIG. 7 is an elevation view of the wafer of FIG. 6 as it is prepared for the thermomigration step.

Referring now to FIG. 7, there is shown the wafer 30 of FIG. 6 prepared for the temperature gradient zone melting, or thermomigration, step. Elongated bodies 37, shown in section in FIG. 7, of a second type of impurity, such as aluminum, are disposed on an oxide layer 40 overlying the major surface 31. (In order to preserve clarity, the oxide layer 40 is not shown in subsequent FIGS. 6 through 10.) The elongated bodies run perpendicularly to the plane of the drawing and thus their size is not fully appreciated solely from FIG. 7.

Referring to FIG. 8, there is shown the wafer 30 of FIG. 7 following the thermomigration step. The elongated bodies of material 37 have migrated, first through the oxide layer 40 and then through the wafer 30 from the major surface 31 to the major surface 32. This vertical migration of each body 37 leaves in its path an isolation region 38 of the composite, P, conductivity type, which region 38 can serve as an isolation region. The isolation regions 38 thus formed are regions of silicon uniformly doped to the solid solubility limit of aluminum in silicon at the temperature of migration. The heavily doped isolation regions really extend completely from one major surface to the other as shown by the combination of solid and broken lines at A for the center region. However, the boundary of the isolation region indicated by the broken lines at A in FIG. 8 has been omitted from the other isolation regions 38 in FIG. 8 and from subsequent drawings for clarity inasmuch as the regions 33 and 34 are P-type regions and thus no P/N junction exists between them and the regions 38.

Essentially, the temperature gradient zone melting process is carried on by exposing the wafer 30 to a temperature gradient while the entire wafer is maintained at an elevated temperature. Typically, if the temperature of the wafer is in excess of about 800° or 900° C, a temperature gradient of a few degrees to a few hundred degrees will cause the aluminum to migrate through the wafer, from cold toward hot, leaving in its trail a recrystallized region doped to the solid solubility limit of aluminum in silicon at the migration temperature. As one example of the time duration involved in the migration process, a temperature of about 1200° C with a temperature gradient of about 5° across the wafer will cause migration in about 5 to 10 minutes.

FIG. 8 shows two device regions separated from each other by the central isolation region 38 at A, and separated from their neighbors by the other isolation regions 38. Each device region consists of an interior region 35 of N-type conductivity completely surrounded by semiconductor material of P-type conductivity. It will be appreciated by those skilled in the art that the entire wafer 30 will usually contain many separate device regions. Furthermore, it will be appreciated by those skilled in the semiconductor art that the isolation regions 38 are formed in a grid pattern and thus extend around the entire periphery of each device region, thereby effectively separating each device region from its neighbors.

Referring to FIG. 9, there is shown an elevation view of the wafer 30 with peripheral grooves 39 formed in the outer region 33 and extending into the interior region 35. The grooves 39 are formed by conventional photolithographic masking and etching techniques and extend along each of the isolation regions as illustrated in FIG. 11.

An examination of FIG. 9 reveals that the portions B of the region 33 within the peripheral groove 39 are electrically isolated from the region 34 due to the back-to-back P/N junctions 41 and 42. Thus, when the grooves are filled with a passivating material 43 as shown best in FIG. 10, the two semiconductor junctions 41 and 42 are completely passivated with a single groove and application of passivant material 43. The passivant material 43 can be glass applied in a known manner. However, it should be appreciated that other passivating material can be used. For example, oxide or a suitable organic passivant material can be advantageously employed.

When wafer 30 is subdivided through the isolation regions 38 as shown in FIG. 10, individual pellets 44 are formed, each constituting an entire individual semiconductor device pellet. Those skilled in the art will recognize the pellets 44 as SCR pellets. Finally, metal contacts 45, 46, and 47 are added in a conventional manner. A plan view of a pellet 44 is shown in FIG. 11.

In view of the foregoing description, it will be appreciated that many modifications and variations of the subject invention will be apparent to those skilled in the art. It is to be understood, therefore, that the scope of this invention is limited only in accordance with the following claims.

What is claimed is:

1. A method of manufacturing semiconductor devices, said method comprising the steps of:
providing a body of semiconductor material, providing an oxide layer on at least selected portions of at least one surface of said body, the oxide of said oxide layer being selected from the group consisting of silicon oxide and germanium oxide;
selectively depositing an impurity material on said oxide layer; and
exposing said body to an elevated temperature and to a thermal migration temperature gradient through said body and said oxide layer, whereby said impurity material thermally migrates through said oxide and said body.

2. A method accoding to claim 1 wherein said oxide layer-providing step comprises the substep of depositing said oxide layer on said one surface.

3. A method according to claim 1 wherein said body is one member of the group consisting of silicon, germanium, silicon carbide, and gallium arsenide.

4. A method according to claim 3 wherein said oxide layer-providing step comprises the substep of thermally growing said oxide layer in situ on said body.

5. A method according to claim 1 wherein said body is silicon.

6. A method according to claim 5 wherein said oxide layer-providing step comprises the substep of thermally growing said oxide layer in situ on said body.

7. A method according to claim 1 wherein said impurity material is selected from the group consisting of aluminum and gallium.

8. A method according to claim 7 wherein said step of selectivity depositing said impurity material comprises blanket deposition and selective photolithographic removal substeps.

9. A method according to claim 1 wherein said impurity material is aluminum.

10. A method according to claim 1 wherein said oxide layer is of a thickness greater than about 6,000 Angstrom units.

11. A method according to claim 10 wherein said oxide layer is about 12,000 Angstrom units in thickness.

12. A method of manufacturing semiconductor devices, said method comprising the steps of:
providing a body of monocrystalline silicon having a layer of silicon oxide on one surface thereof;
selectively depositing an impurity material on said oxide layer; and
exposing said body to an elevated temperature and inducing a temperature gradient across said body and oxide layer such that said impurity thermally migrates through said oxide layer and then through said body.

13. A method according to claim 12 wherein said body is a wafer.

14. A method according to claim 12 wherein said step of providing comprises the substep of thermally growing said oxide layer.

15. A method according to claim 12 wherein said oxide layer is of a thickness greater than about 6,000 Angstrom units.

16. A method according to claim 15 wherein said oxide layer is about 12,000 Angstrom units in thickness.

17. A method according to claim 12 wherein said impurity is aluminum.

18. A method according to claim 17 wherein said step of selectively depositing said impurity material comprises blanket deposition and selective photolithographic removal substeps.

19. A method according to claim 18 wherein said oxide layer is of a thickness greater than about 6,000 Angstrom units.

20. A method according to claim 19 wherein said oxide layer is about 12,000 Angstrom units in thickness.

* * * * *

UNITED STATES PATENT AND TRADEMARK OFFICE
CERTIFICATE OF CORRECTION

PATENT NO. : 4,076,559

DATED : Feb. 28, 1978

INVENTOR(S) : Mike F. Chang, et al.

It is certified that error appears in the above-identified patent and that said Letters Patent are hereby corrected as shown below:

Claim 2, Col. 6, line 33, delete "accoding" and insert -- according --.

Claim 8, Col. 6, line 51, delete "selectivity" and insert -- selectively --.

Signed and Sealed this

Thirteenth Day of June 1978

[SEAL]

Attest:

RUTH C. MASON
Attesting Officer

DONALD W. BANNER
Commissioner of Patents and Trademarks